United States Patent
Penning et al.

(10) Patent No.: US 9,886,835 B2
(45) Date of Patent: Feb. 6, 2018

(54) METHOD AND APPARATUS FOR PREDICTING LIFETIME OF A SOLENOID COIL

(71) Applicant: General Equipment and Manufacturing Company, Inc., Louisville, KY (US)

(72) Inventors: Bruce R. Penning, Louisville, KY (US); Bruce Rigsby, Charlestown, IN (US)

(73) Assignee: AUTOMATIC SWITCH COMPANY, Florham Park, NJ (US)

( * ) Notice: Subject to any disclaimer, the term of this patent is extended or adjusted under 35 U.S.C. 154(b) by 0 days.

(21) Appl. No.: 14/907,545

(22) PCT Filed: Aug. 1, 2014

(86) PCT No.: PCT/US2014/049339
§ 371 (c)(1),
(2) Date: Jan. 25, 2016

(87) PCT Pub. No.: WO2015/017747
PCT Pub. Date: Feb. 5, 2015

(65) Prior Publication Data
US 2016/0180686 A1 Jun. 23, 2016

Related U.S. Application Data

(60) Provisional application No. 61/861,349, filed on Aug. 1, 2013.

(51) Int. Cl.
*G08B 21/18* (2006.01)
*G05B 23/02* (2006.01)
*G01R 31/00* (2006.01)

(52) U.S. Cl.
CPC .......... *G08B 21/18* (2013.01); *G01R 31/003* (2013.01); *G05B 23/0283* (2013.01)

(58) Field of Classification Search
CPC ... G08B 21/18; G01R 31/003; G05B 23/0283
(Continued)

(56) References Cited

U.S. PATENT DOCUMENTS

| 5,311,562 A | * | 5/1994 | Palusamy | G21C 17/00 376/215 |
| 2010/0155634 A1 | * | 6/2010 | do Amaral | G05B 23/024 251/129.01 |

(Continued)

FOREIGN PATENT DOCUMENTS

| EP | 0892231 | 1/1999 |
| EP | 1895452 | 3/2008 |

(Continued)

OTHER PUBLICATIONS

PCT Search Report for PCT Application No. PCT/US14/49339 dated Nov. 4, 2014.
(Continued)

*Primary Examiner* — Omar Casillashernandez
(74) *Attorney, Agent, or Firm* — Locke Lord LLP

(57) ABSTRACT

In a method for estimating a remaining lifetime of a solenoid coil of a valve controller operating in a process control system, a record of a duration of activation of the solenoid coil is maintained during operation of the solenoid coil. An operating temperature of the solenoid coil is determined. An estimate of the remaining lifetime of the solenoid coil is generated based on the duration of activation of the solenoid coil and the operating temperature of the solenoid coil.

18 Claims, 4 Drawing Sheets

(58) Field of Classification Search
USPC .......................................................... 340/635
See application file for complete search history.

(56) References Cited

U.S. PATENT DOCUMENTS

| | | | | |
|---|---|---|---|---|
| 2011/0174343 | A1* | 7/2011 | Azuma | G01N 35/1016 |
| | | | | 134/113 |
| 2012/0022797 | A1 | 1/2012 | Maruyama | |
| 2012/0136587 | A1* | 5/2012 | Nagathil | G05B 19/4065 |
| | | | | 702/34 |
| 2014/0261791 | A1* | 9/2014 | Grabau | F16K 37/0075 |
| | | | | 137/551 |

FOREIGN PATENT DOCUMENTS

| | | | |
|---|---|---|---|
| EP | 1985452 | * | 5/2008 |
| EP | 2202600 | | 6/2010 |
| EP | 2330426 | | 6/2011 |

OTHER PUBLICATIONS

PCT Written Opinion for PCT Application No. PCT/US14/49339 dated Nov. 4, 2014.

* cited by examiner

METHOD AND APPARATUS FOR PREDICTING LIFETIME OF A SOLENOID COIL

FIELD OF THE INVENTION

The present invention relates generally to solenoid coils, more particularly, to predicting lifetime of solenoid coils.

DESCRIPTION OF THE RELATED ART

Process control systems, such as distributed or scalable process control systems like those used in chemical, petroleum or other processes, typically include one or more process controllers communicatively coupled to at least one host or user workstation and to one or more field devices via analog, digital or combined analog/digital buses. The field devices, which may include, for example, control valves, valve positioners, switches and transmitters (e.g., temperature, pressure and flow rate sensors), perform functions within the process such as opening or closing valves and measuring process parameters. The process controller receives signals indicative of process measurements made by the field devices and/or other information pertaining to the field devices, and uses this information to implement a control routine to generate control signals, which are sent over the buses to the field devices to control the operation of the process. Information from each of the field devices and the controller is typically made available to one or more applications executed by the user workstation to enable an operator to perform any desired function regarding the process, such as viewing the current state of the process, modifying the operation of the process, etc. In the event that a field device fails, the operational state of the entire process control system can be jeopardized.

Some of the field devices include or are coupled to solenoid coil valves that are used in controlling operation of the field devices. Solenoid coils in such devices have limited life spans and typically fail after a certain period of activation time. When a solenoid coils in a control device fails, the control device seizes to operate properly. However, current control devices that rely on solenoid coils to control operation of a field device lack capability to predict remaining lifetime of a solenoid coil and to alert plant personnel of an imminent failure of the controller.

SUMMARY

In accordance with a first exemplary aspect, a method for estimating a remaining lifetime of a solenoid coil of a valve controller operating in a process control system includes maintaining a record of a duration of activation of the solenoid coil. The method further includes determining an operating temperature of the solenoid coil. The method additionally includes generating an estimate of the remaining lifetime of the solenoid coil based on the duration of activation of the solenoid coil and the operating temperature of the solenoid coil.

In further accordance with the first exemplary aspect, the method may further include, in any combination, any one or more of the following preferred forms:

In one preferred form, maintaining the record of the duration of activation of the solenoid coil comprises storing a value of the duration of activation of the solenoid coil, initiating a timer when the solenoid coil is activated, and incrementing the value of the duration of activation of the solenoid coil based on the timer.

In another preferred form, determining the operating temperature of the solenoid coil comprises obtaining a measurement of the operating temperature of the solenoid coil from a temperature sensor.

In another preferred form, estimating the remaining lifetime of the solenoid coil comprises determining, based on the operating temperature, an average expected lifetime of an insulation of the solenoid coil, and calculating the remaining lifetime of the solenoid coil by subtracting the duration of activation of the solenoid coil from the average expected lifetime of the insulation of the solenoid coil.

In another preferred form, the method further comprises comparing the estimate of the remaining lifetime of the solenoid coil to a threshold value, and generating an alert indication in response to determining that the estimate of the remaining lifetime of the solenoid coil is below the threshold value.

In another preferred form, the acts of determining the operating temperature of the solenoid coil and generating the estimate of the remaining lifetime of the solenoid coil are performed periodically during operation of the solenoid coil.

In another preferred form, the method further comprises causing the alert indication to be displayed to a user.

In another preferred form, the method further comprises detecting an imminent failure of the solenoid coil, and generating an alert indication in response to detecting the imminent failure of the solenoid coil.

In another preferred form, detecting the immanent failure comprises measuring a current draw of the solenoid coil, comparing the current draw to a threshold value, and detecting the immanent failure in response to determining that the current draw exceeds the threshold value.

In another preferred form, measuring the current draw of the solenoid coil comprises measuring inrush current of the solenoid valve.

In accordance with a second exemplary aspect, a valve controller coupled to a control valve operating in a process control system comprises a solenoid valve having a solenoid coil. The control valve also comprises an electronic module configured to maintain a record of a duration of activation of the solenoid coil, determine an operating temperature of the solenoid coil, and generate an estimate of a remaining lifetime of the solenoid coil based on the duration of activation of the solenoid coil and the operating temperature of the solenoid coil.

In further accordance with the second exemplary aspect, the valve controller may further include, in any combination, any one or more of the following preferred forms:

In one preferred form, the electronic module is configured to maintaining the record of the duration of activation of the solenoid coil by initiating a timer each time the solenoid coil is activated and incrementing a stored value of the duration of activation of the solenoid coil based on the timer.

In another preferred form, the valve controller further comprises a temperature sensor adapted to measure the operating temperature of the solenoid coil, wherein the electronic module is configured to obtaining the operating temperature of the solenoid coil from the temperature sensor.

In another preferred form, the electronic module is configured to determine, based on the operating temperature of the solenoid coil, an average expected lifetime of an insulation of the solenoid coil, and calculate the remaining lifetime of the solenoid coil by subtracting the duration of activation of the solenoid coil from the average expected lifetime of the solenoid coil.

In another preferred form, the electronic module is further configured to compare the estimate of the remaining lifetime of the solenoid coil to a threshold value, and generate an alert indication in response to determining that the estimate of the remaining lifetime of the solenoid coil is below the threshold value.

In another preferred form, the electronic module is configured to perform the acts of determining the operating temperature of the solenoid coil and determining the estimate of the remaining lifetime of the solenoid coil periodically during operation of the solenoid coil.

In another preferred form, the electronic module is further configured to cause the alert indication to be displayed to a user.

In another preferred form, the valve controller further comprises a power monitoring circuit coupled to a power supply line of the solenoid coil and is adapted to provide a measurement of a current draw of the solenoid coil to the electronic module.

In another preferred form, the electronic module is further configured to compare the current draw to a threshold value and detect an imminent failure of the solenoid coil in response to determining that the current draw exceeds the threshold value.

In another preferred form, the valve controller according to any of the preceding claims, wherein the power circuit is adapted to provide a measurement of inrush current of the solenoid valve to the electronic module.

In another preferred form, the electronic module is further configured to generate an alert indication in response to detecting the imminent failure of the solenoid coil, and cause the alert indication to be displayed to a user.

DETAILED DESCRIPTION OF THE DRAWINGS

DETAILED DESCRIPTION

The present disclosure is directed to an intelligent controller for a field device of a process control system such as a valve controller, for example, and, specifically, to a valve controller having a solenoid coil and capable of predicting the remaining lifetime of the solenoid coil at certain times or time intervals during operation of the valve controller. The disclosed methods for predicting solenoid coil lifetime allow control devices that utilize solenoid coils to, for example, alert process plant personnel that a solenoid coil is nearing end of life, allowing process plant personnel to replace the solenoid coil, or to take another preventative action, prior to a failure of the solenoid coil. Because a repair can be made before the solenoid coil seizes to operated properly, potentially costly effects of an unnecessary shutdown of a process can be avoided. Also, potentially dangerous situations that can result from a failure of the control device, such as when the control device controls operation of an emergency shutdown valve, for example, can be avoided.

Figure 1:
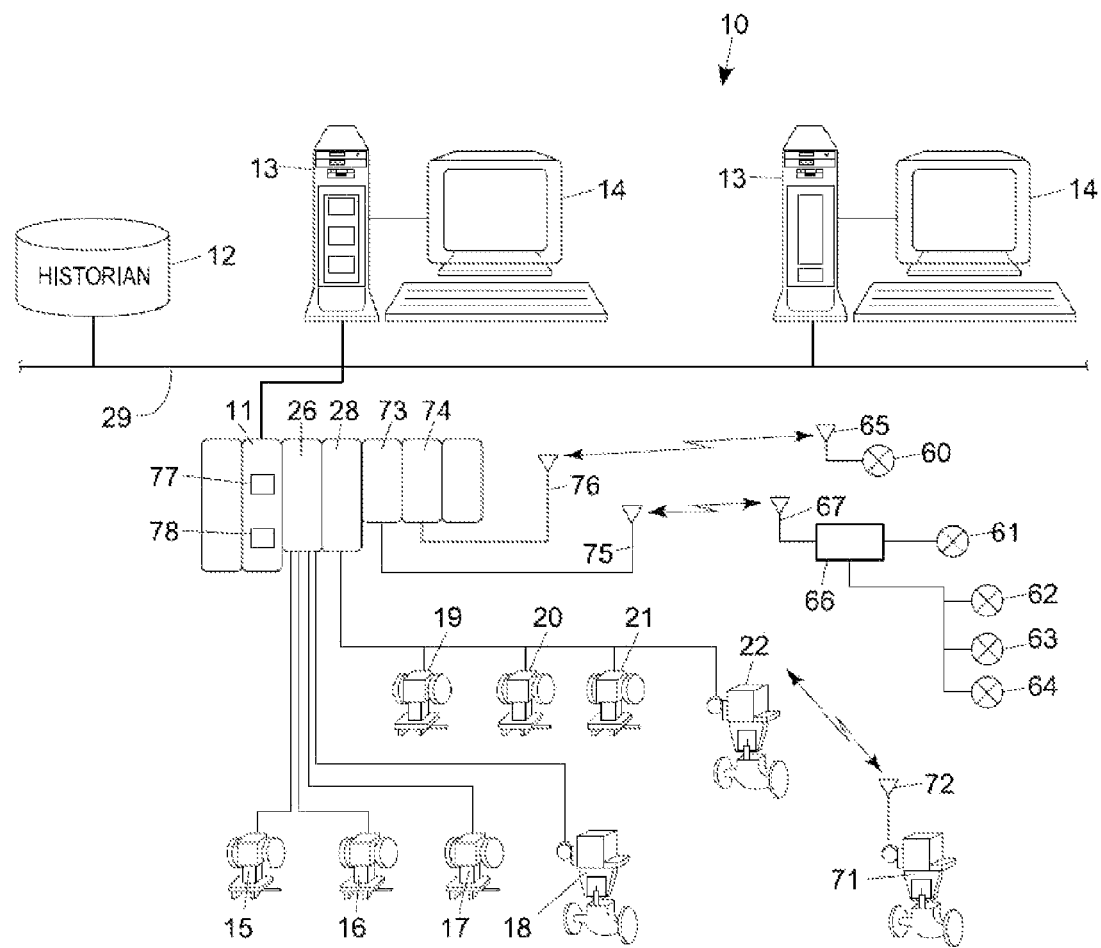
FIG. 1 illustrates an example process control system environment in which solenoid coil lifetime prediction may be utilized, according to an embodiment.

Referring now to FIG. 1 a process control system 10 constructed in accordance with one version of the present disclosure is depicted incorporating one or more field devices 15, 16, 17, 18, 19, 20, 21, 22, and 71 in communication with a process controller 11, which in turn, is in communication with a data historian 12 and one or more user workstations 13, each having a display screen 14. So configured, the controller 11 delivers signals to and receives signals from the field devices 15, 16, 17, 18, 19, 20, 21, 22, and 71 and the workstations 13 to control the process control system.

In additional detail, the process controller 11 of the process control system 10 of the version depicted in FIG. 1 is connected via hardwired communication connections to field devices 15, 16, 17, 18, 19, 20, 21, and 22 via input/output (I/O) cards 26 and 28. The data historian 12 may be any desired type of data collection unit having any desired type of memory and any desired or known software, hardware or firmware for storing data. Moreover, while the data historian 12 is illustrated as a separate device in FIG. 1, it may instead or in addition be part of one of the workstations 13 or another computer device, such as a server. The controller 11, which may be, by way of example, a DeltaV™ controller sold by Emerson Process Management, is communicatively connected to the workstations 13 and to the data historian 12 via a communication network 29 which may be, for example, an Ethernet connection.

As mentioned, the controller 11 is illustrated as being communicatively connected to the field devices 15, 16, 17, 18, 19, 20, 21, and 22 using a hardwired communication scheme which may include the use of any desired hardware, software and/or firmware to implement hardwired communications, including, for example, standard 4-20 mA communications, and/or any communications using any smart communication protocol such as the FOUNDATION® Fieldbus communication protocol, the HART® communication protocol, etc. The field devices 15, 16, 17, 18, 19, 20, 21, and 22 may be any types of devices, such as sensors, control valve assemblies, transmitters, positioners, etc., while the I/O cards 26 and 28 may be any types of I/O devices conforming to any desired communication or controller protocol. In the embodiment illustrated in FIG. 1, the field devices 15, 16, 17, 18 are standard 4-20 mA devices that communicate over analog lines to the I/O card 26, while the digital field devices 19, 20, 21, 22 can be smart devices, such as HART® communicating devices and Fieldbus field devices, that communicate over a digital bus to the I/O card 28 using Fieldbus protocol communications. Of course, the field devices 15, 16, 17, 18, 19, 20, 21, and 22 may conform to any other desired standard(s) or protocols, including any standards or protocols developed in the future.

In addition, the process control system 10 depicted in FIG. 1 includes a number of wireless field devices 60, 61, 62, 63, 64 and 71 disposed in the plant to be controlled. The field devices 60, 61, 62, 63, 64 are depicted as transmitters (e.g., process variable sensors) while the field device 71 is depicted as a control valve assembly including, for example, a control valve and an actuator. Wireless communications may be established between the controller 11 and the field devices 60, 61, 62, 63, 64 and 71 using any desired wireless communication equipment, including hardware, software, firmware, or any combination thereof now known or later developed. In the version illustrated in FIG. 1, an antenna 65 is coupled to and is dedicated to perform wireless communications for the transmitter 60, while a wireless router or other module 66 having an antenna 67 is coupled to collectively handle wireless communications for the transmitters 61, 62, 63, and 64. Likewise, an antenna 72 is coupled to the control valve assembly 71 to perform wireless communications for the control valve assembly 71. The field devices or associated hardware 60, 61, 62, 63, 64, 66 and 71 may implement protocol stack operations used by an appropriate wireless communication protocol to receive, decode, route, encode and send wireless signals via the antennas 65, 67 and 72 to implement wireless communications between the process controller 11 and the transmitters 60, 61, 62, 63, 64 and the control valve assembly 71.

If desired, the transmitters 60, 61, 62, 63, 64 can constitute the sole link between various process sensors (transmitters) and the process controller 11 and, as such, are relied upon to send accurate signals to the controller 11 to ensure that process performance is not compromised. The transmitters 60, 61, 62, 63, 64, often referred to as process variable transmitters (PVTs), therefore may play a significant role in the control of the overall control process. Additionally, the control valve assembly 71 may provide measurements made by sensors within the control valve assembly 71 or may provide other data generated by or computed by the control valve assembly 71 to the controller 11 as part of its operation. Of course, as is known, the control valve assembly 71 may also receive control signals from the controller 11 to effect physical parameters, e.g., flow, within the overall process.

The process controller 11 is coupled to one or more I/O devices 73 and 74, each connected to a respective antenna 75 and 76, and these I/O devices and antennas 73, 74, 75, 76 operate as transmitters/receivers to perform wireless communications with the wireless field devices 61, 62, 63, 64 and 71 via one or more wireless communication networks. The wireless communications between the field devices (e.g., the transmitters 60, 61, 62, 63, 64 and the control valve assembly 71) may be performed using one or more known wireless communication protocols, such as the WirelessHART® protocol, the Ember protocol, a WiFi protocol, an IEEE wireless standard, etc. Still further, the I/O devices 73 and 74 may implement protocol stack operations used by these communication protocols to receive, decode, route, encode and send wireless signals via the antennas 75 and 76 to implement wireless communications between the controller 11 and the transmitters 60, 61, 62, 63, 64 and the control valve assembly 71.

As illustrated in FIG. 1, the controller 11 conventionally includes a processor 77 that implements or oversees one or more process control routines (or any module, block, or sub-routine thereof) stored in a memory 78. The process control routines stored in the memory 78 may include or be associated with control loops being implemented within the process plant. Generally speaking, and as is generally known, the process controller 11 executes one or more control routines and communicates with the field devices 15, 16, 17, 18, 19, 20, 21, 22, 60, 61, 62, 63, 64, and 71, the user workstations 13 and the data historian 12 to control a process in any desired manner(s). Additionally, any one of the field devices 18, 22, and 71 in FIG. 1, each of which is depicted as a control valve assembly, can include an intelligent control valve actuator constructed in accordance with the principles of the present disclosure for communicating with the process controller 11 in order to facilitate monitoring of the actuator's health and integrity.

Figure 2:
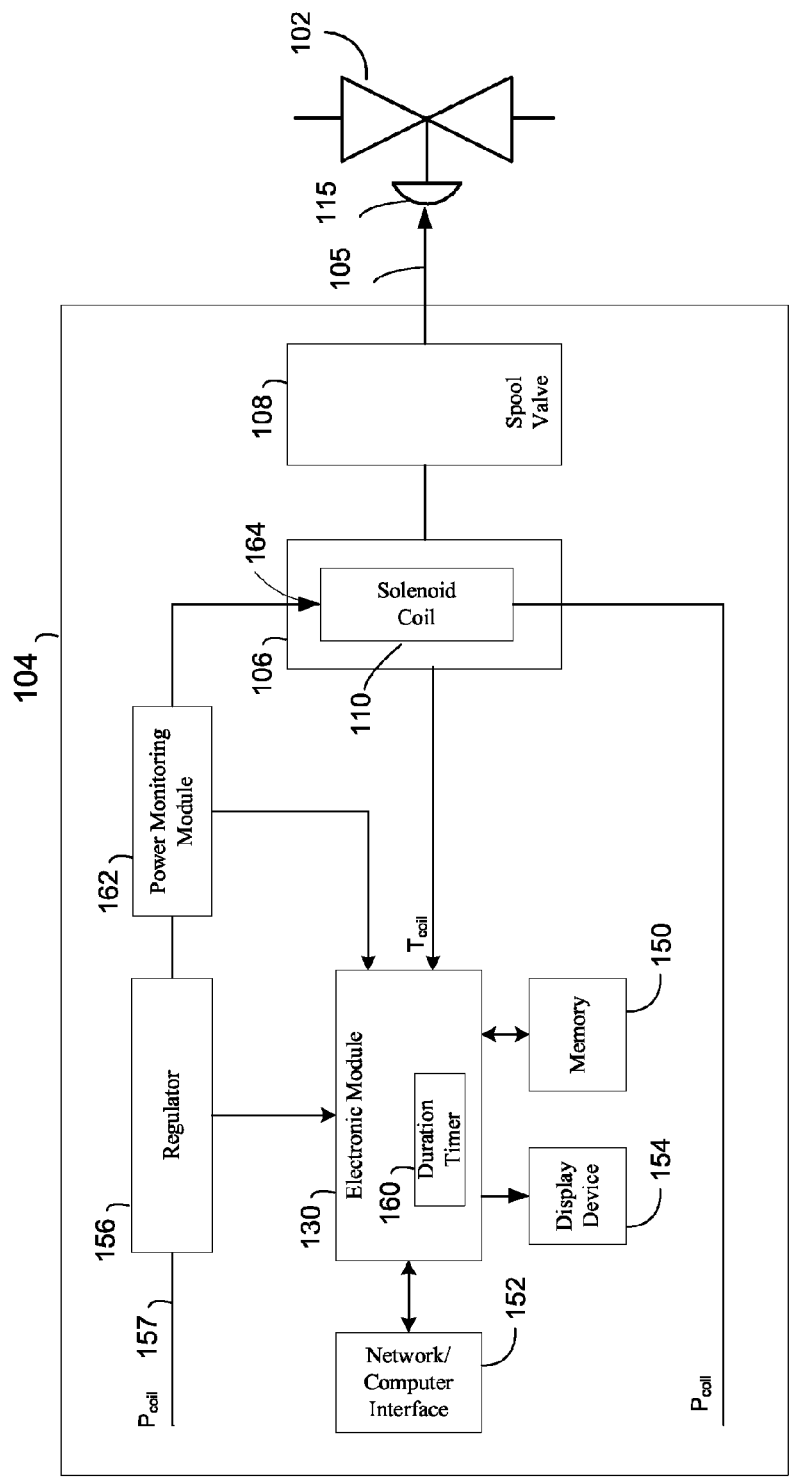
FIG. 2 illustrates an example valve control system in which solenoid coil lifetime prediction may be utilized, according to an embodiment.

Referring now to FIG. 2, for the sake of description, a field device operating within a process control system (e.g., the process control system of FIG. 1), such as, e.g., the field device 18 or the field device 71 of FIG. 1 is illustrated as a control valve 102 coupled to a valve controller 104. The valve controller 104 may operate to control the position (e.g., percentage open or closed) of the control valve 102 based on a control command that the valve controller 104 receives from a control system. Control valve 102 may be on ON/OFF valve used in an emergency shutdown system (ESD) used, for example, to shut down the flow of a hazardous liquid upon detection of an emergency event, or may be any other type of a control valve used to control flow of a liquid in a process system. The example valve controller 104 controls the position of the control valve 102 by controlling, adjusting and/or selecting a pressure of a pneumatic control line 105. The pressure of the pneumatic control line 105 controls the position of an actuator 115 associated with the control valve 102 and, thus, the position of the process control valve 102.

In the example configuration depicted in FIG. 2, the valve controller 102 is a pilot operated controller that includes a solenoid valve (sometimes referred to herein as a "pilot valve") 106 coupled to a spool valve 108. In the illustrated configuration, the valve controller 102 controls position of the control valve 104 via the solenoid valve 106 and the spool valve 108. In other embodiments, the valve controller 102 omits the spool valve 108 and utilizes the solenoid valve 106 to directly control position of the control valve 104. The solenoid valve 106 includes a solenoid coil 110 and operates by controlling, selecting or adjusting a power supply signal of the solenoid coil 110 to control the state of the solenoid valve 106. For example, in operation, when the power signal of the solenoid coil 110 is selected to have a first voltage, energizing the solenoid coil 110, the solenoid valve 106 operates in a first state (e.g., open). On the other hand, when power is removed from the solenoid coil 110, de-energizing the solenoid coil 110, the pilot valve 108 transitions to a second, de-energized, state (e.g., closed). Alternatively, the when the solenoid coil 110 is energized, the pilot valve 106 operates in the second state (e.g., closed), and when the solenoid coil 110 is energized, the pilot valve 106 operates in the first state (e.g., open). In any event, the solenoid valve 106 controls the position of the spool valve 108 which, in turn, controls the position of the control valve 102 by controlling or adjusting the pneumatic signal 105 to the actuator 115.

The valve controller 102 further includes an electronic module 130 configured to periodically (e.g., at certain times or time intervals during operation of the solenoid coil 110) predict the remaining lifetime of the solenoid coil 110. In an embodiment, the electronic module 130 predicts the remaining lifetime of the solenoid coil 110 based on a theoretical average lifetime of insulation of the solenoid coil 110. Generally speaking, insulation of the solenoid coil has a limited lifetime the duration of which is affected by "aging" temperature to which the insulation of the solenoid coil 110 is subjected during operation of the solenoid coil 110. Thus, the remaining lifetime of the solenoid coil 110 at a given time during operation of the solenoid coil 110 can generally be determined or estimated based on the operating temperature of the solenoid coil 110 and the duration of time for which the solenoid coil 110 has already been active during the lifetime of the solenoid coil 110. Accordingly, in an embodiment, the electronic module 130 measures or otherwise determines the operating temperature of the solenoid coil 110 and also maintains a record of activation duration of the solenoid coil 110 and utilizes the measured or estimated operating temperature and the activation duration of the solenoid coil 110 to predict or estimate the remaining lifetime of the solenoid coil 110 for example at certain times or certain time intervals during operation of the solenoid coil 110.

Figure 3:
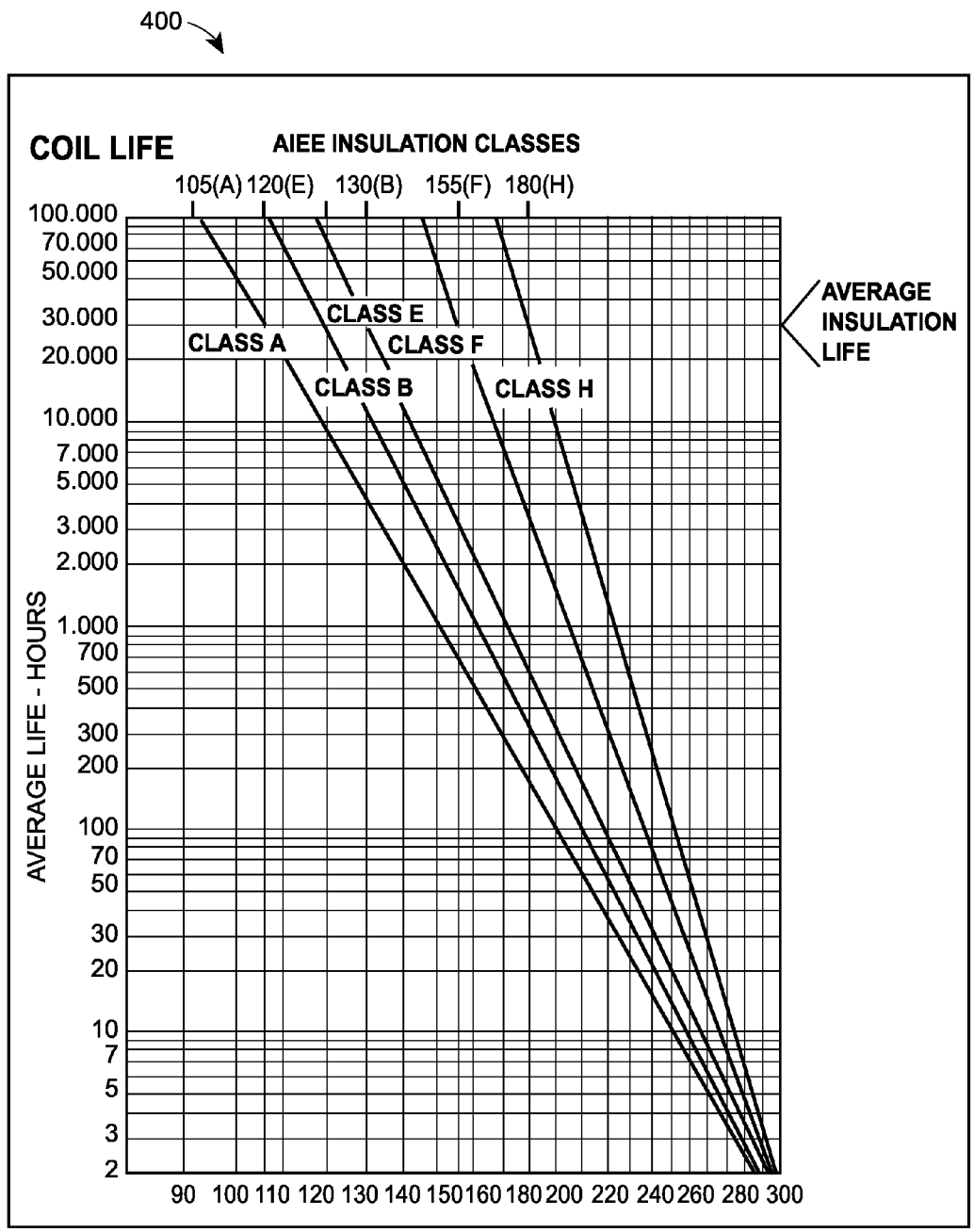
FIG. 3 illustrates an example coil life expectancy plot.

Referring briefly to FIG. 3, plots 300 illustrate average life expectancy vs. aging temperature for several typical insulation materials that may be used as insulators of the solenoid coil 110 of FIG. 2 in some embodiments. Accordingly, data provided by the plots 300 may be utilized by the valve electronic module 130 to predict, at a given time during operation of the solenoid coil 110, the remaining lifetime of the solenoid coil 110. More specifically, the electronic module 130 may utilize data provided on a plot 300 to determine an average expected lifetime of the solenoid coil 110 based on operating temperature of the solenoid coil 110. For example, if the solenoid coil 110 is insulated with a class A insulator, and the operating temperature of the solenoid coil 110 is 220° C., then the estimated expected lifetime of the insulation of the solenoid coil 110 and, accordingly, the estimated expected lifetime of the solenoid coil 110, is approximately 30 hours. Using such data provided by an appropriate plot 300 (i.e., the plot 300 which correspond to the insulator class of the insulation of the solenoid coil 110), and based on the operating temperature of the solenoid coil 110 and the duration of time for which, the valve controller 102 can determine or estimate the remaining lifetime of the solenoid coil 108.

Referring again to FIG. 2, the valve controller 104 may include a power regulator 156 coupled to a power line 157, which power line 157 is used to supply power to the solenoid coil 110 to energize the solenoid coil 110. The power regulator 156 is adapted to convert the power (voltage) supplied to the solenoid coil 110 to a voltage suitable for powering the electronic module 130. The regulator 156, thus, allows the electronic module 130 to be powered from the same power line (and at the same time or times) that provides power for energizing the solenoid coil 110. Additionally, the electronic module 130 is coupled to a memory 150 and an interface 152 (e.g., a network interface of other interface such as a computer interface that allows for a computing device to be connected to the electronic module 130, for example to download diagnostic data stored in the memory 150). The memory 150 may be a non-volatile memory such as a read only memory (ROM) or other type of non-volatile memory. Accordingly, the memory 150 may preserve data stored in the memory 150 when the electronic module 130 is powered down (e.g., when solenoid coil 110 is de-energized and is not receiving power via the power line 157). Although the memory 150 and the interface 152 are illustrated in FIG. 2 as components external to the electronic module 130, one or both of the memory 150 and the network interface 152 are included internally to the module 130 in some embodiments.

The electronic module 130 may determine or estimate operating temperature of the solenoid coil 110 via a temperature sensor included in or coupled to the electronic module 130. Alternatively, the electronic module 130 may determine operating temperature of the solenoid coil 110 based on other parameter (e.g., coil resistance) obtained from or determined for the solenoid coil 110. The electronic module 130 is configured to determine, at certain points in time during operation of the solenoid coil 110, the remaining lifetime of the solenoid based on the total duration of time during which the solenoid coil 110 has been active and, further, based on the operating temperature of the solenoid coil 110 obtained from or determined for the solenoid coil 110. For example, the electronic module 130 may obtain data regarding an average lifetime of the solenoid coil 110 from a look-up table which stores values representing, for example, data points of an appropriate curve of the plot 300 of FIG. 3. The look-up table may be stored in the memory 150 or other memory included in or coupled to the electronic module 130, for example. Alternatively, the electronic module 130 may determine an average lifetime of the solenoid coil 110, based on the operating temperature of the solenoid coil 130, algorithmically, using an algorithmic calculation developed based on the data provided the plot 300, for example.

The electronic module 130 includes a duration timer 160 used by the electronic module 130 to maintain a record of total duration of active time of the solenoid coil 110. The electronic module 130 may be configured to initiate the time 160 each time the solenoid coil 110 is activated. In an embodiment in which the electronic module 130 is powered via the same power line as the power used to energize the solenoid coil 110 (e.g., via the power line 157 via the regulator 156), the electronic module 130 may be configured to initiate the timer 160 each time the electronic module 130 is powered up via the regulator 156. The electronic module 130 may be configured to periodically store the value of the timer 160 in the memory 150. For example, the electronic module 130 may be configured to maintain a record of the total active time duration of the solenoid coil 110 by periodically incrementing a value of the total active time duration stored in the memory 150 by the value of the timer 160, and to then re-initiate the timer 160. Alternatively, as another example, the electronic module 130 is configured to continually run the timer 160 for the duration of active (i.e., energized) time of the coil 110, and to periodically record the value of the timer 160 in the memory 150 so that the value of the timer 160 can subsequently be used to determine the total duration of active time of the solenoid coil 110. At a given point in time, during operation of the solenoid coil 110, the electronic module 130 is able to determine or estimate the remaining lifetime of the solenoid coil 110 by subtracting the duration of active time of the solenoid coil 110 from the expected average lifetime of the solenoid coil 110.

In an embodiment, the electronic module 130 is configured to generate an alert signal when the predicted or estimated remaining lifetime of the solenoid coil 110 crosses a certain predetermined threshold. To detect that the solenoid coil 110 is nearing the end of life, the electronic module 130 may compare the remaining lifetime estimate to a threshold and to determine that the solenoid coil 110 is nearing the end of life if the remaining lifetime estimate is below the threshold. The threshold may be a predetermined threshold (e.g., 90 day or another suitable value) or may be configurable by the operator of the valve controller 104, for example. The electronic module 130 may be coupled to a display device 154 and may be configured, in response to detecting that the solenoid coil 110 is nearing the end of life, to control the display device 154 to change state to alert process plant personnel. For example, the display device 154 may be a light emitting diode (LED) or another suitable device that may be controlled by the electronic module 130 to indicate to an operator of the valve controller 104 or to other process plant personnel. Additionally or alternatively, the electronic module 130 may be configured to cause an alert signal indicating that the solenoid coil 110 is nearing end of life to be transmitted to a control system (e.g., to a host station within a control system) via the interface 152, or may be configured to provide another suitable indication that the solenoid coil 110 is nearing end of life. For example, the display device 154 may be a light emitting diode (LED) or another suitable device that may be controlled by the electronic module 130 to indicate to an operator of the valve controller 104 or to other process plant personnel.

Additionally or alternatively, in some embodiments, the electronic module 130 is configured to detect immanent failure of the solenoid coil 110. To this end, the valve controller 102 may include a power monitoring module (e.g., a circuit) 162 disposed in series with the power input terminal 164 of the solenoid coil 110. The power monitoring module 162 is configured to detect a current flow in the solenoid coil 106. For example, the power monitoring module 162 is configured to detect operating current flow in the solenoid coil 110 or an inrush current, or a surge current that (typically) occurs at coil energization of the solenoid coil 110. The power monitoring module 162 is coupled to the electronic module 130 and provides power monitoring data (e.g., current flow measurements) to the electronic module 130.

The electronic module 130 may utilize the power measurements provided by the power monitoring module 162 to detect an imminent failure of the solenoid coil 110. For example, the electronic module 130 may periodically perform a comparison of the power measurements (e.g., operating current flow, inrush current flow, or other suitable power measurements) to predetermined threshold values (e.g., stored in the memory 150), and may determine that a failure of the solenoid coil 110 is imminent when one or more power measurements exceed or fall below corresponding threshold values. In response to detecting an imminent failure of the solenoid coil 110, the electronic module 130 may generate an alarm signal indicating to an operator of the valve controller or other process plant personnel that a failure of the solenoid coil 110 is imminent. For example, the electronic module 130 may cause the alarm to be displayed via the display device 154 and/or may cause an alarm signal to be transmitted to a control system (e.g., to a host station within the control system) via the interface 152.

Figure 4:
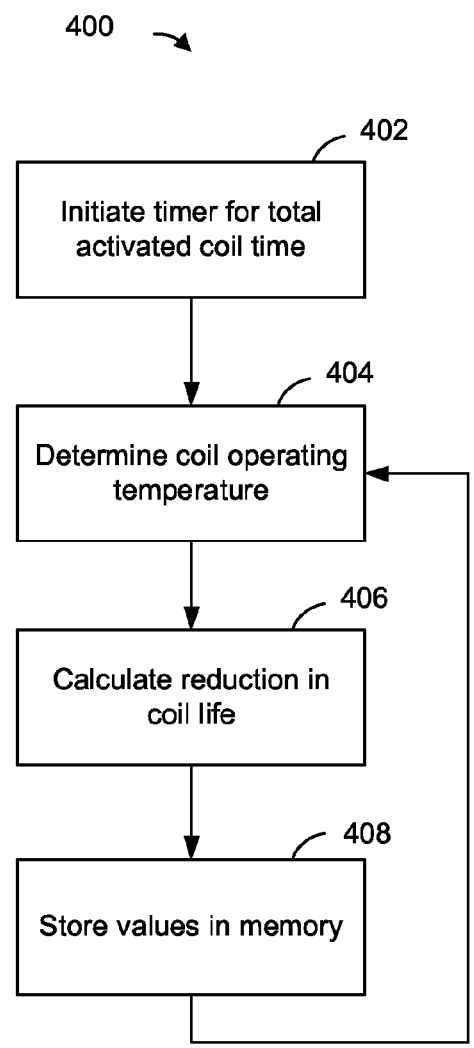
FIG. 4 illustrates a procedure for predicting solenoid coil lifetime, according to an embodiment

FIG. 4 is a flow chart of a procedure 400 implemented by the electronic module 130 to estimate the remaining lifetime of the solenoid coil 110 during operation of the solenoid coil 110, according to an embodiment. The procedure 400 may begin each time the solenoid coil 110 is activated and may be continually conducted for the duration of time that the solenoid coil 110 is active. Upon activation of the solenoid coil 110, the electronic module 130 initiates a timer (block 402). The timer may be continually incremented (e.g., every second, every minute, every hour, etc.) to count the time for which the solenoid coil 110 is active. The electronic module 130 measures or otherwise obtains the current operating temperature of the solenoid coil 110 (block 404). For example, the electronic module 130 may obtain or determine current operating temperature of the solenoid coil 110 at predetermined times or time intervals during operation of the solenoid coil 110.

Based on the total duration of activation of the solenoid coil 110 and on the current operating temperature of the solenoid coil 110, the electronic module 130 estimates the remaining lifetime of the solenoid coil 110 (block 406). For example, the electronic module 130 determines the remaining lifetime of the solenoid coil 110 by estimating the average lifetime of the solenoid coil 110 based on the operating temperature of the solenoid coil 110 and expected average lifetime of coil insulation (e.g., based on an appropriate plot 300 of FIG. 3 for insulator class of insulation used for insulating the solenoid coil 110) and then subtracting the total active duration of the solenoid coil 110 from the expected lifetime of insulation of the solenoid coil 110. The electric controller 130 also saves in a memory (e.g., the memory 150) one or more of: the value of the active time duration timer, the value of the current operating temperature of the solenoid coil 110, the average expected lifetime of the solenoid coil 110 and/or the remaining lifetime of the solenoid coil 110 (block 408). The stored diagnostic information may be subsequently provided to a control system, for example, and/or may be downloaded to a computing device via the interface 152. The electronic controller 130 may be configured to perform actions of blocks 404-408 periodically during the operation of the solenoid coil 110, such as at certain times of at certain time intervals, for example.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention. It is intended that the specification and examples be considered as exemplary only, with a true scope and spirit of the invention being indicated by the following claims.

The invention claimed is:

1. A method for estimating a remaining lifetime of a solenoid coil of a valve controller operating in a process control system, the method comprising:
   maintaining, with the valve controller, a record of a duration of activation of the solenoid coil;
   determining, with the valve controller, an operating temperature of the solenoid coil; and
   generating, with the valve controller, an estimate of the remaining lifetime of the solenoid coil based on the duration of activation of the solenoid coil and on the operating temperature of the solenoid coil;
   wherein generating the estimate of the remaining lifetime of the solenoid coil comprises:
   determining, based on the operating temperature, an average expected lifetime of an insulation of the solenoid coil; and
   calculating the remaining lifetime of the solenoid coil by subtracting the duration of activation of the solenoid coil from the average expected lifetime of the insulation of the solenoid coil.

2. The method according to claim 1, wherein maintaining the record of the duration of activation of the solenoid coil comprises:
   storing a value of the duration of activation of the solenoid coil;
   initiating a timer when the solenoid coil is activated; and
   incrementing the value of the duration of activation of the solenoid coil based on the timer.

3. The method according to claim 1, wherein determining the operating temperature of the solenoid coil comprises obtaining a measurement of the operating temperature of the solenoid coil from a temperature sensor.

4. The method according to claim 1, further comprising:
   comparing the estimate of the remaining lifetime of the solenoid coil to a threshold value; and
   generating an alert indication in response to determining that the estimate of the remaining lifetime of the solenoid coil is below the threshold value.

5. The method according to claim 1, wherein the acts of determining the operating temperature of the solenoid coil and generating the estimate of the remaining lifetime of the solenoid coil are performed periodically during operation of the solenoid coil.

6. The method according to claim 4, further comprising causing the alert indication to be displayed to a user.

7. The method according to claim 1, further comprising:
   detecting an imminent failure of the solenoid coil; and
   generating an alert indication in response to detecting the imminent failure of the solenoid coil.

8. The method according to claim 7, wherein detecting the imminent failure comprises:
   measuring a current draw of the solenoid coil;
   comparing the current draw to a threshold value; and
   detecting the imminent failure in response to determining that the current draw exceeds the threshold value.

9. The method according to claim 8, wherein measuring the current draw of the solenoid coil comprises measuring inrush current of the solenoid valve.

10. A valve controller coupled to a control valve operating in a process control system, the valve controller comprising:
   a solenoid valve having a solenoid coil; and
   an electronic module configured to:
   maintain a record of a duration of activation of the solenoid coil;
   determine an operating temperature of the solenoid coil; and
   generate an estimate of a remaining lifetime of the solenoid coil based on the duration of activation of the solenoid coil and the operating temperature of the solenoid coil;
   wherein generating the estimate of the remaining lifetime of the solenoid coil comprises:
   determining, based on the operating temperature, an average expected lifetime of an insulation of the solenoid coil; and
   calculating the remaining lifetime of the solenoid coil by subtracting the duration of activation of the solenoid coil from the average expected lifetime of the insulation of the solenoid coil.

11. The valve controller according to claim 10, wherein the electronic module is configured to maintain the record of the duration of activation of the solenoid coil by:
   initiating a timer each time the solenoid coil is activated; and
   incrementing a stored value of the duration of activation of the solenoid coil based on the timer.

12. The valve controller according to claim 10, further comprising a temperature sensor adapted to measure the operating temperature of the solenoid coil, wherein the electronic module is configured to obtain the operating temperature of the solenoid coil from the temperature sensor.

13. The valve controller according to claim 10, wherein the electronic module is further configured to:
   compare the estimate of the remaining lifetime of the solenoid coil to a threshold value; and
   generate an alert indication in response to determining that the estimate of the remaining lifetime of the solenoid coil is below the threshold value.

14. The valve controller according to claim 10, wherein the electronic module is configured to determine the operating temperature of the solenoid coil and generate the estimate of the remaining lifetime of the solenoid coil periodically during operation of the solenoid coil.

15. The valve controller according to claim 14, wherein the electronic module is further configured to cause the alert indication to be displayed to a user.

16. The valve controller according to claim 10, further comprising a power monitoring circuit coupled to a power supply line of the solenoid coil, the power monitoring circuit configured to provide a measurement of a current draw of the solenoid coil to the electronic module, wherein the electronic module is further configured to:
   compare the current draw to a threshold value; and
   detect an imminent failure of the solenoid coil in response to determining that the current draw exceeds the threshold value.

17. The valve controller according to claim 16, wherein the power monitoring circuit is configured to provide a measurement of inrush current of the solenoid valve to the electronic module.

18. The valve controller according to claim 16, wherein the electronic module is further configured to:
   generate an alert indication in response to detecting the imminent failure of the solenoid coil; and
   cause the alert indication to be displayed to a user.

* * * * *